US006284633B1

(12) United States Patent
Nagabushnam et al.

(10) Patent No.: US 6,284,633 B1
(45) Date of Patent: *Sep. 4, 2001

(54) METHOD FOR FORMING A TENSILE PLASMA ENHANCED NITRIDE CAPPING LAYER OVER A GATE ELECTRODE

(75) Inventors: Rajan Nagabushnam, Austin; Stanley M. Filipiak, Pflugerville; Bruce Boeck, Austin, all of TX (US)

(73) Assignee: Motorola Inc., Schaumburg, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/976,469

(22) Filed: Nov. 24, 1997

(51) Int. Cl.[7] .................... H01L 21/3205; H01L 21/4763
(52) U.S. Cl. ..................... 438/585; 438/592; 438/153
(58) Field of Search ..................... 438/585, 786, 438/339, 305, 296, 231, 153, 34, 514, 601; 365/174; 156/653; 118/723; 29/571

(56) References Cited

U.S. PATENT DOCUMENTS

| 4,660,276 | * | 4/1987 | Hsu .......................... 29/571 |
| 4,837,185 | * | 6/1989 | Yau et al. ...................... 438/786 |
| 4,917,044 | * | 4/1990 | Yau et al. ...................... 118/723 |
| 4,940,509 | * | 7/1990 | Tso ............................ 156/653 |
| 5,061,656 | * | 10/1991 | Moyer et al. .................... 438/786 |
| 5,198,375 | * | 3/1993 | Hayden et al. ................... 438/339 |
| 5,296,385 | * | 3/1994 | Moslehi et al. .................. 438/514 |
| 5,364,810 | * | 11/1994 | Kosa et al. ..................... 438/153 |
| 5,416,736 | * | 5/1995 | Kosa et al. ..................... 365/174 |
| 5,439,831 | * | 8/1995 | Schwalke et al. ................. 438/305 |
| 5,510,295 | * | 4/1996 | Cabral, Jr. et al. ............... 438/656 |
| 5,654,242 | * | 8/1997 | Komatsu ........................ 438/585 |
| 5,707,986 | * | 1/1998 | Chiang et al. ................... 438/231 |
| 5,753,548 | * | 5/1998 | Yu et al. ....................... 438/231 |
| 5,780,346 | * | 7/1998 | Arghavani et al. ................ 438/296 |
| 5,895,262 | * | 4/1999 | Becker et al. ................... 438/601 |
| 6,002,202 | * | 12/1999 | Meyer et al. .................... 313/420 |

OTHER PUBLICATIONS

R.F. Bunshah, "Handbook of Deposition Technologies for Films and Coatings", 2nd Edition, Noyes Publications, NJ, 1994.*

Ogawa et a., "Practical resolution enhancement effect by new complete anti–reflective layer in KrF excimer laser lithography", SPIE vol. 1927 Optical/Laser/Microlithography VI (1993), pp. 263–274, 1993.*

S. Wolf and R.N. Tauber, "Silicon Processing for the VLSI Era", vol. 1, p. 192, Lattice Press, Sunset Beach, CA, 1986.*

* cited by examiner

Primary Examiner—Olik Chaudhuri
Assistant Examiner—Ginette Peralta
(74) Attorney, Agent, or Firm—Jeffrey S. Abel; Robert A. Rodriguez

(57) ABSTRACT

A tPEN layer (108) having a tensile stress is formed over a conductive gate stack (104–106) provided on a semiconductor substrate. Following the formation of the conductive gate stack (104–106), an anneal is performed. The conductive gate stack includes a metal layer to prevent outgassing and poly depletion during the anneal. Next, a photoresist layer (110) is formed and patterned to form a gate (122, 124).

21 Claims, 2 Drawing Sheets

METHOD FOR FORMING A TENSILE PLASMA ENHANCED NITRIDE CAPPING LAYER OVER A GATE ELECTRODE

FIELD OF THE INVENTION

The present invention relates generally to semiconductor manufacturing, and particularly to formation of a gate stack of a semiconductor device having a particular structure.

BACKGROUND OF THE INVENTION

FIG. 1 illustrates a prior art gate stack, particularly a high performance gate stack associated with logic devices and memory cells such as static random access memories (SRAMs). The gate stack 5 includes a substrate 10, a gate oxide layer 12, a composite conductive gate layer 13, including first poly layer 14, second poly layer 16, and tungsten silicide layer 18. The poly layers 14, 16 are formed of polycrystalline silicon, as is well known in the art.

According to the prior art, the structure is subjected to a rapid thermal anneal step, generally at a temperature above 850° C., so that the tungsten silicide layer 18 changes phases, from an amorphous phase to a tetragonal crystalline phase. This phase change is effective in lowering the sheet resistance of the composite conductive gate layer 13 (e.g., 80 to 20 ohms per square). After the rapid thermal anneal step is carried out, a silicon glue layer 20 is formed on the tungsten silicide layer 18, as shown in FIG. 2. Next, an anti-reflective coating (ARC) layer 22 is formed over the silicon glue layer 20. The function of the silicon glue layer 20 is to provide an interfacial layer whereby the subsequently formed ARC layer 22 adheres to the tungsten silicide layer 18. As is known in the art, the ARC layer 22 is formed to prevent unwanted and detrimental reflection of energy during subsequent photolithography steps. Next, a silicon nitride layer 24 is formed. The silicon nitride layer acts as an etch stop layer in subsequent etch steps and insulates the gate stack from conductive layers that form contacts that are dropped thereon to active regions (not shown) of the substrate 10. The silicon nitride layer 24 is formed by LPCVD (low-pressure chemical vapor deposition) as is well known in the art.

The present inventors have recognized numerous problems associated with the gate structure illustrated in FIGS. 1 and 2, including poly depletion and out-gassing. Poly depletion occurs when dopants implanted into the poly layers 14, 16 are out-gassed during the rapid thermal anneal step noted above. For example, if the poly layers 14, 16 of gate stack 5 have been doped with phosphorous, the rapid thermal anneal step causes the phosphorous to out-gas. This out-gassing causes build-up of phosphorous pentaoxide along the chamber walls, and an increase in sheet resistance of the composite conductive gate layer 13. This build-up causes problems during subsequent annealing steps of other materials. For example, other materials including Ti, TiN and W that are used for formation of tungsten plugs. The phosphorous pentaoxide build-up in the anneal chamber migrates and contaminates the structure during heating. Such contamination causes voids in the tungsten during plug deposition, resulting in reduced reliability of the semiconductor device.

In addition to phosphorous, other dopants such as arsenic can also lead to contamination of the Ti/TiN layers. Further, use of arsenic raises additional health and safety concerns that must be addressed during purge cycles and chamber cleaning processes. One method that has been considered to address the out-gassing issue calls for provision of a dedicated anneal chamber for steps where out-gassing occurs. However, this results in increased manufacturing costs and does not resolve the issues associated with the safety and cleaning of such tools.

Further, the inventors investigated another method for addressing the out-gassing and poly depletion issues with respect to the prior art. Particularly, the inventors considered forming the silicon glue layer 20, the ARC layer 22, and the silicon nitride layer 24 prior to rapid thermal anneal. However, it was found that those layers peeled from the gate stack, which was believed to be due to the intrinsic compressive stress of the silicon nitride layer 24. Accordingly, this particular process flow was not a viable solution to the out-gassing and poly depletion of the prior art.

An additional drawback of the prior art is the required number of steps used in forming the layers illustrated in FIG. 2. Specifically, the steps of forming the silicon glue layer 20, the ARC layer 22, and the nitride layer 24 are laborious and expensive.

DETAILED DESCRIPTION OF THE DRAWINGS

Figure 1:
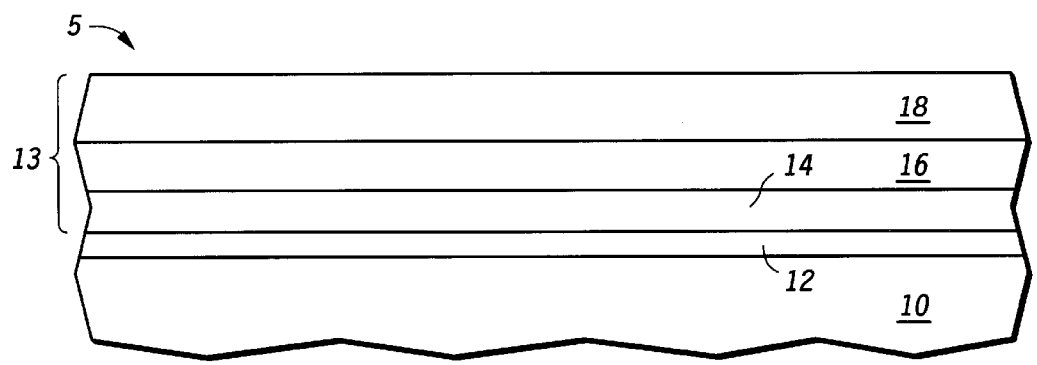
FIGS. 1 and 2 illustrate cross-sectional views of layers associated with the polysilicon gate structure of the prior art.
Figure 2:
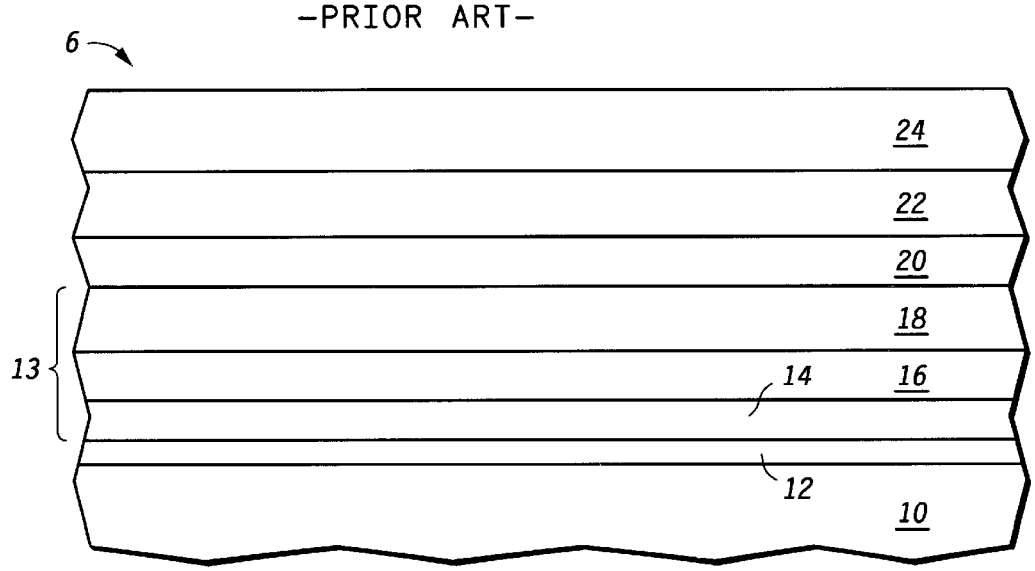
Figure 3:
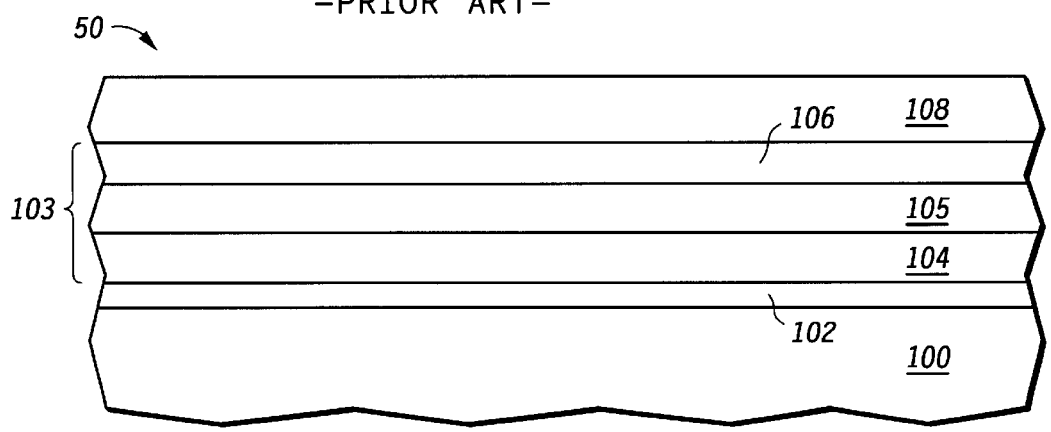
FIG. 3 illustrates a cross-sectional view of layers according to the gate stack of one embodiment of the present invention.
Figure 4:
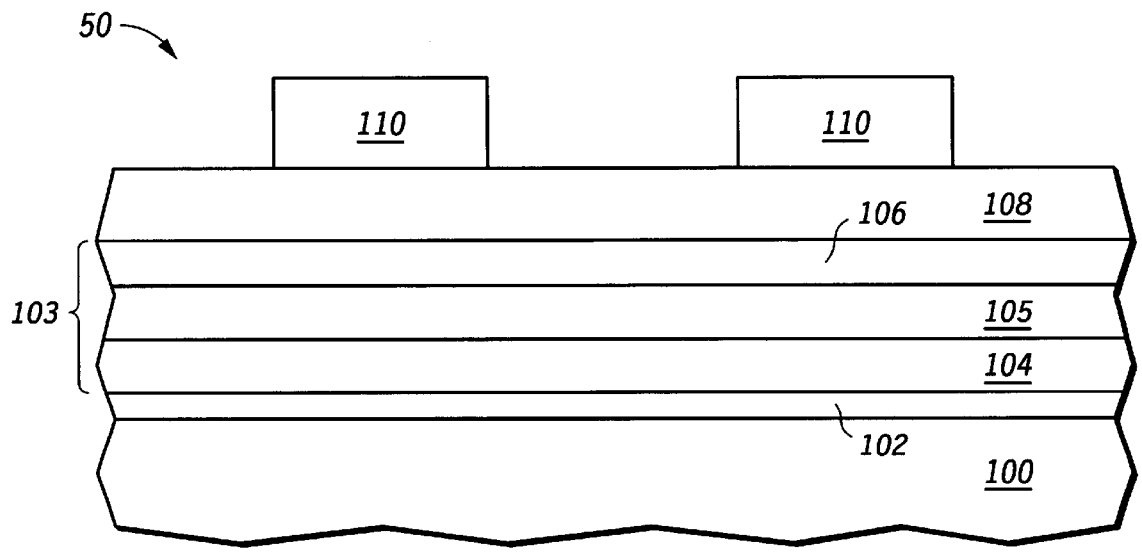
FIG. 4 illustrates a cross-sectional view of the layers of FIG. 3 following an anneal step, and the formation and patterning of a photoresist layer.
Figure 5:
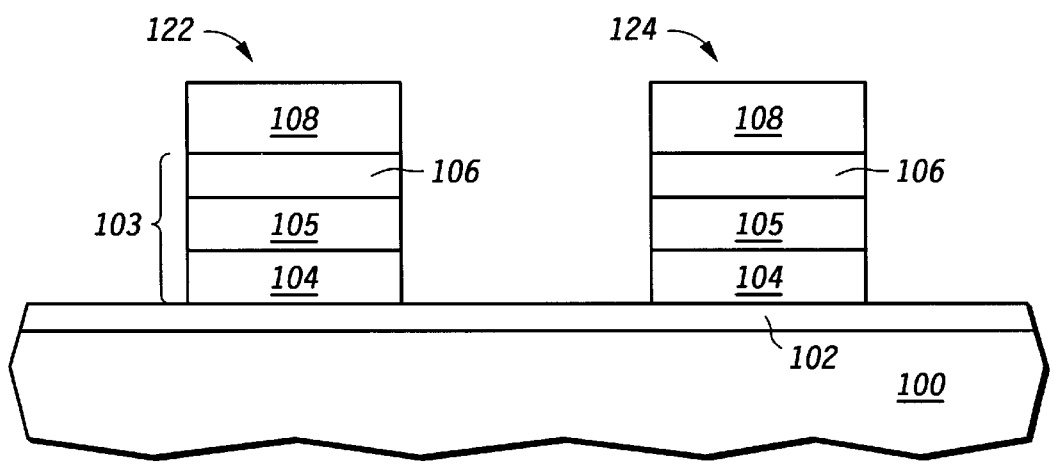
FIG. 5 illustrates the semiconductor device of FIG. 4, following patterning to form semiconductor gates.

The present invention is best understood with reference to FIGS. 3–5. FIG. 3 illustrates a cross-sectional view of a semiconductor substrate 100, having gate dielectric layer 102 formed thereon. The substrate 100 may be a single crystalline silicon substrate, but may also be polycrystalline silicon, silicon on insulator (SOI), as well as other semiconducting materials. The gate dielectric layer 102 is a gate oxide layer ($SiO_2$) formed by a thermal oxidation process.

Next, a composite conductive gate layer 103 is formed. In the particular embodiment shown, the composite conductive gate layer 103 includes a first poly layer 104, a second poly layer 105, and a tungsten silicide layer 106. The poly layers 104, 105 and the tungsten silicide layer 106 are formed by conventional techniques as are well known in the art. Each of the poly layers is a doped polycrystalline silicon layer. Note that the composite conductive gate layer 103 could also be embodied as a single metal layer or multiple metal layers. In addition, the tungsten silicide layer 106 may be formed of other metal silicides.

Next, according to a particular development of the present invention, a nitride cap layer, particularly, a tensile Plasma Enhanced Silicon Nitride (tPEN) layer 108 is formed on the tungsten silicide layer 106. This tPEN layer 108 is formed to be tensile, i.e., having an associated tensile stress. As the name suggests, tPEN layer 108 is formed by plasma-enhanced chemical vapor deposition (PECVD). As is understood in the art, PECVD is distinguished from other chemical vapor deposition techniques, such as low pressure chemical vapor deposition (LPCVD). PECVD utilizes an RF (radio frequency)-induced glow discharge to transfer energy into reactant gases in a reactor, allowing the substrate to remain at relatively low temperatures, typically well below those associated with LPCVD. PECVD may also be used to form a silicon oxynitride rather than silicon nitride.

The gate stack 50, which includes layers 102, 104, 105, 106, and 108, as illustrated in FIG. 3, is now subjected to a heating process. Particularly, a rapid thermal anneal of greater than approximately 850° C., such as 850–1,000° C., or 875–950° C., is performed. During this anneal process, the tungsten silicide layer 106 changes phases, from amorphous to tetragonal.

According to the present invention, dopants present within poly layers 104, 105 are prohibited from out-gassing because of the presence of the tPEN layer 108. According to the present invention, the tPEN layer 108 is present before rapid thermal anneal. This is made possible by imparting tensile characteristics to the tPEN layer 108, which is effective to prevent peeling between the tPEN layer 108 and the tungsten silicide layer 106 during heating. Particularly, flaking and peeling are eliminated because the tPEN layer 108 has sufficient tensile stress to endure the stresses associated with the anneal process. Accordingly, poly depletion and chamber contamination are avoided. As a result, the sheet resistivity of the composite conductive gate layer 103 and contamination during subsequent processing does not occur.

FIG. 4 illustrates the stack 50 following patterning of a photoresist layer 110. The photoresist layer 110 has been patterned to define exposed regions of the gate stack and identify location of gate features as is known in the art.

FIG. 5 illustrates the resulting gates 122, 124 after etching through layers 108, 106, 105, and 104. After formation of gates 122, 124, self-aligned source and drain regions are formed in the substrate 100 on opposing sides of the gates, by implants as known in the art. Carrying out patterning and formation of the gates 122, 124 after the rapid thermal anneal is another advantage of the present invention. While the tPEN layer 108 would prevent out-gassing of dopants through the tungsten silicide layer 106, if annealing followed patterning, the tPEN layer 108 (which would now be patterned), would not prevent out-gassing through exposed peripheral edges of the poly layers 104, 105.

In order to overcome the stresses of the anneal process, it is important to control the tensile stress of the tPEN layer 108. It has been determined that a tensile stress in excess of approximately 300 MPa, as deposited, is needed. Generally, the tensile stress is higher as deposited on the conductive gate stack; after deposition, the tensile stress drops to a value not less than 150 MPa, preferably not less than 200 MPa. The tensile stress should not be greater than approximately 2,000 MPa, preferably not greater than 1,000 MPa. In addition, it is desirable to minimize the hydrogen present in the tPEN layer 108, to avoid hydrogen contamination of the device. In one embodiment of the present invention, a hydrogen concentration of less than approximately 8 atomic percent, such as 3–8 Atomic percent, has been used in the gaseous mixture for forming the tPEN layer 108. However, greater hydrogen concentrations are feasible, provided that the tensile characteristics are maintained and no detrimental effects to the semiconductor device occur as the result of the hydrogen content. Preferably, the nitride cap layer has a hydrogen concentration of less than 10 atomic percent, such as 1–10 atomic percent as measured by fourier-transform infrared (FT-IR) analysis. It is noted that poly layers 104, 105 have a thickness within a range of about 300 to 800 angstroms, such as about 550 angstroms. The tungsten silicide layer 106 has a thickness within a range of 750 to 1250 angstroms. The tPEN layer 108 has a thickness within a range of 1000 to 1500 angstroms.

One of ordinary skill in the art will recognize that many specific embodiments for forming the tPEN layer may exist. Approximate ranges of a specific process flow are provided below for use with an AMAT 5200 Centura™ with DxZ™ chambers.

Setup steps:
  pressure: 3.0 to 6.0 Torr;
  temperature: 200 to 500° C.;
  RF power: 0 Watts;
  Spacing: 450 to 700 mils;
  Silane Flow: 75 to 200 sccms;
  NH3 flow: 60 to 250 sccms;
  N2 flow: 2000 to 5000 sccms;
Pre-deposition step:
  pressure: 3.0 to 6.0 Torr;
  temperature: 200 to 500° C.;
  RF power: 150 to 500 Watts;
  Spacing: 450 to 700 mils;
  Silane Flow: 75 to 200 sccms;
  NH3 flow: 60 to 250 sccms;
  N2 flow: 2000 to 5000 sccms;
Deposition step:
  pressure: 3.0 to 6.0 Torr;
  temperature: 200 to 500° C.;
  RF power: 150 to 500 Watts;
  Spacing: 450 to 700 mils;
  Silane Flow: 220 to 500 sccms;
  NH3 flow: 60 to 250 sccms;
  N2 flow: 2000 to 5000 sccms;

In one embodiment of the present invention, the following steps have been used to achieve the desired results, in connection with AMAT 5200 Centura™ with DxZ™ chambers.

Setup steps:
  time: 38 seconds;
  pressure: 4.55 Torr;
  temperature: 400° C.;
  RF power: 0 Watts;
  Spacing: 610 mils;
  Silane Flow: 164 sccms;
  NH3 flow: 120 sccms;
  N2 flow: 3200 sccms;
Pre-deposition step:
  time: 2 seconds;
  pressure: 4.55 Torr;
  temperature: 400° C.;
  RF power: 280 Watts;
  Spacing: 610 mils;
  Silane Flow: 164 sccms;
  NH3 flow: 120 sccms;
  N2 flow: 3900 sccms.
Deposition step:
  time: 3.9 seconds; (Dependent upon desired thickness)
  pressure 4.55 Torr;
  temperature: 400° C.;
  RF power: 290 Watts;
  Spacing: 610 mils;
  Silane Flow: 348 sccms;
  NH3 flow: 120 sccms;
  N2 flow: 3200 sccms Pump down step:
  time: 10 seconds;
  pressure: throttle full open;
  temperature: 400° C.;
  RF power: 0 Watts;
  Spacing: 610 mils;
  Silane Flow: −1 sccms (pumps to valve);
  NH3 flow: −1 sccms (pumps to valve);
N2 flow: −1 sccms (pumps to valve).

The present invention has an additional advantage over the prior art in that it reduces overall device complexity by replacing the layers 20, 22 and 24 of the prior art with a single tPEN layer 108.

Therefore, the present invention provides a unique gate stack which prevents poly depletion, and contamination during subsequent steps. One skilled in the art will recognize that the present invention can be expanded to cover structures other that the gate stack(s) discussed. For example it may be advantageous to form the tPEN layer over any metal containing layer, such as a metal gate layer replacing the poly layers. In addition, any structure, where there is a mismatch between expansion characteristics of the layers, may use the disclosed tPEN layer because its ability to resist flaking and peeling. Likewise, a structure where outgassing is a potential problem can benefit by the barrier characteristics of the tPEN layer.

What is claimed is:

1. A method of forming a semiconductor device, comprising the sequential steps of:
   forming a gate dielectric layer over a semiconductor substrate;
   forming a doped polysilicon layer over the gate dielectric layer;
   forming a metal-containing layer over the doped polysilicon layer;
   forming a plasma enhanced chemically vapor deposited nitride-containing capping layer at a temperature less than approximately 500° C. over the metal-containing layer, wherein the nitride containing capping layer has a deposited tensile stress greater than approximately 300 MPa, and wherein a combination of the gate dielectric layer, the doped polysilicon layer, the metal-containing layer, and the nitride-containing capping layer form a gate stack;
   annealing the gate stack;
   patterning a resist layer over the gate stack to define a gate pattern; and
   etching the gate stack to form a gate.

2. The method of claim 1, wherein annealing the gate stack is carried out at a temperature of approximately 850 to 1000° C.

3. The method of claim 2, wherein the nitride-containing capping layer is further characterized as a silicon nitride layer.

4. The method of claim 3, wherein the silicon nitride capping layer has a tensile stress greater than 150 MPa after the step of annealing.

5. The method of claim 1, wherein the deposited tensile stress is in a range of 300–1000 MPa.

6. The method of claim 1, wherein forming a plasma enhanced chemically vapor deposited nitride-containing capping layer includes flowing a gaseous mixture into a plasma enhanced chemical vapor deposition reactor, wherein the gaseous mixture contains hydrogen, and the nitride-containing capping layer is formed having a hydrogen content within a range of 1 to 10 atomic %.

7. The method of claim 6, wherein the gaseous mixture includes 3 to 8 atomic % hydrogen.

8. The method of claim 6, wherein the gaseous mixture is subjected to an RF power of 150 to 500 Watts.

9. The method of claim 1, further comprising forming source and drain regions in the semiconductor substrate, on opposing sides of the gate after annealing the gate stack.

10. The method of claim 1, wherein the nitride-containing capping layer is further characterized as a silicon oxynitride layer.

11. The method of claim 1, wherein the metal-containing layer is further characterized as a metal silicide layer.

12. The method of claim 11, wherein the metal silicide layer is further characterized as a tungsten silicide layer.

13. The method of claim 12, wherein annealing the gate stack changes a phase of the tungsten silicide layer from an amorphous phase to a tetragonal crystalline phase and no peeling of the nitride-containing capping layer occurs as a result of annealing.

14. The method of claim 1, wherein the nitride-containing capping layer is further characterized as an antireflective layer.

15. The method of claim 14, wherein the antireflective layer additionally prevents outgassing of dopants from the doped polysilicon layer during annealing.

16. The method of claim 15, wherein the antireflective layer additionally acts as an etch stop layer in subsequent etch steps and insulates the gate stack from conductive layers that form contacts to active regions of the semiconductor substrate.

17. The method of claim 1, wherein forming the nitride-containing capping layer having a deposited tensile stress greater than 300 MPa comprises:
   placing the semiconductor substrate into a plasma enhanced chemical vapor deposition chamber; and
   depositing the nitride containing capping layer using a deposition process having a processing temperature that is in a range of approximately 375–425° C., a process pressure that is in a range of approximately 4–5 Torr, an RF power that is in a range of approximately 250–350 Watts, a silane flow rate that is in a range of approximately 325–375 sccm, a $NH_3$ flow rate that is in a range of approximately 115–125 sccms, and an $N_2$ flow rate that is in a range of approximately 3100–3300 sccms.

18. A method of forming a semiconductor device, comprising the sequential steps of:
   forming a gate dielectric layer over a semiconductor substrate;
   forming a doped polysilicon layer over the gate dielectric layer;
   forming a tungsten silicide layer over the polysilicon layer;
   forming a plasma enhanced chemically vapor deposited silicon nitride antireflective layer on the tungsten silicide layer at a temperature less than approximately 500° C., wherein the silicon nitride antireflective layer has a deposited tinsel stress greater than 300 megapascals;
   annealing the semiconductor substrate to change a phase of the tungsten silicide layer from an amorphous phase to a tetragonal crystalline phase, wherein the silicon nitride antireflective layer prevents outgassing of dopants from the polysilicon layer during annealing;
   patterning a resist layer on the silicon nitride antireflective layer to define exposed and unexposed regions;

etching exposed regions defined by the photoresist layer to form a gate electrode from remaining portions of the tungsten silicide layer, the doped polysilicon layer, and the gate dielectric layer and an etch stop capping layer from remaining portions of the silicon nitride antireflective layer.

19. The method of claim 18, wherein annealing semiconductor substrate is carried out at a temperature of approximately 850 to 1000° C. and wherein a post anneal stress of the silicon nitride antireflective layer is greater than 150 MPa.

20. The method of claim 18, wherein the deposited tensile stress of the silicon nitride antireflective layer prevents peeling of the silicon nitride antireflective layer during annealing the semiconductor substrate.

21. The method of claim 19 further comprising forming a conductive layer that forms a contact to an active region of the semiconductor substrate, wherein the etch stop capping layer insulates a portion of the gate electrode from the conductive layer.

* * * * *